(12) United States Patent
Liang

(10) Patent No.: US 10,346,668 B2
(45) Date of Patent: Jul. 9, 2019

(54) CAPACITIVE SENSING CIRCUIT

(71) Applicant: SHENZHEN GOODIX TECHNOLOGY CO., LTD., Shenzhen (CN)

(72) Inventor: Yu An Liang, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 42 days.

(21) Appl. No.: 15/784,068

(22) Filed: Oct. 13, 2017

(65) Prior Publication Data

US 2018/0089489 A1    Mar. 29, 2018

Related U.S. Application Data

(63) Continuation of application No. PCT/CN2016/100453, filed on Sep. 27, 2016.

(51) Int. Cl.
*H03M 1/00* (2006.01)
*H03M 1/06* (2006.01)
*G06K 9/00* (2006.01)

(52) U.S. Cl.
CPC ............ *G06K 9/0002* (2013.01); *H03M 1/00* (2013.01); *H03M 1/06* (2013.01)

(58) Field of Classification Search
CPC ........... G06K 9/002; H03M 1/06; H03M 1/00
(Continued)

(56) References Cited

U.S. PATENT DOCUMENTS 4,649,403 A * 3/1987 Miura ................ G03G 15/6514
                                                        346/145
6,636,053 B1    10/2003 Gozzini
(Continued)

FOREIGN PATENT DOCUMENTS

CN      102954753 A     3/2013
CN      102957404 A     3/2013
(Continued)

OTHER PUBLICATIONS

International Search Report for International Application No. PCT/CN2016/100453, Applicant: Shenzhen Goodix Technology Co., Ltd., Jun. 30, 2017, 5 pages.

*Primary Examiner* — Jerome Grant, II

(57) ABSTRACT

A capacitive sensing circuit (10) includes a sample-and-hold circuit (SH) coupled to a contact capacitor (Cf); an integrating circuit (100) coupled to the sample-and-hold circuit (SH); a comparator (comp) including a first input terminal coupled to the integrating circuit (100), a second input terminal for receiving a reference voltage ($V_{REF}$), and a comparison output terminal for outputting a comparison output voltage ($V_{CMP}$); a logic circuit (102) coupled to the comparison output terminal, where the logic circuit (102) outputs an integration time ($T_{OUT}$) of the integrating circuit (100) when the comparison output voltage ($V_{CMP}$) indicates that the comparator (comp) performs a transition, where the integration time ($T_{OUT}$) correlates with a capacitance value of the contact capacitor (Cf).

5 Claims, 1 Drawing Sheet

(58) Field of Classification Search
USPC .......................................................... 382/125
See application file for complete search history.

(56) References Cited

U.S. PATENT DOCUMENTS

| | | | |
|---|---|---|---|
| 9,164,137 B2 | 10/2015 | Page et al. | |
| 2009/0237386 A1* | 9/2009 | Wu ...................... | G09G 3/3688 |
| | | | 345/211 |
| 2012/0038498 A1* | 2/2012 | Oshima ............... | H03M 1/1033 |
| | | | 341/110 |
| 2013/0321325 A1 | 12/2013 | Jo et al. | |
| 2014/0176482 A1 | 6/2014 | Wei et al. | |
| 2015/0145564 A1* | 5/2015 | Gailhard ................ | H03K 3/012 |
| | | | 327/109 |
| 2015/0162932 A1 | 6/2015 | Page et al. | |
| 2016/0307019 A1 | 10/2016 | Zhang et al. | |
| 2016/0328592 A1 | 11/2016 | Li | |
| 2018/0365974 A1* | 12/2018 | Haas ...................... | G01R 33/09 |

FOREIGN PATENT DOCUMENTS

| | | |
|---|---|---|
| CN | 103714330 A | 4/2014 |
| CN | 105046194 A | 11/2015 |
| CN | 105335737 A | 2/2016 |
| EP | 1308878 A2 | 5/2003 |
| KR | 20160087389 A | 7/2016 |
| WO | 2015096807 A1 | 7/2015 |

\* cited by examiner

CAPACITIVE SENSING CIRCUIT

CROSS-REFERENCE TO RELATED APPLICATIONS

This application is a continuation of International Application No. PCT/CN2016/100453, filed on Sep. 27, 2016, the disclosure of which is hereby incorporated by reference in its entirety.

TECHNICAL FIELD

The present disclosure relates to a capacitive sensing circuit, and in particular, to a capacitive sensing circuit with a simple circuit configuration.

BACKGROUND

With the ever-changing technology, more portable electronic devices such as mobile phone, digital camera, tablet computer and notebook computer have become a necessary tool for people's lives. Since a portable electronic device is generally used by an individual and it has a certain property of privacy, the data such as a telephone book, a photograph, personal information and the like stored therein is privately owned. If the electronic device is lost, the data may be used by others, resulting in unnecessary losses. While a manner of password protection has been used at present to avoid that the electronic device is used by others, a password is easy to be leaked or deciphered with lower security. Moreover, a user is required to remember the password when using an electronic device. If the password is forgotten, it will cause a lot of inconvenience. Therefore, a personal fingerprint identification system is developed currently to achieve identity authentication, so as to enhance data security.

In general, a capacitive sensing circuit is used to receive finger contact in a fingerprint identification system. The capacitive sensing circuit is used to accept finger contact and form a contact capacitor with a finger. The capacitive sensing circuit may convert a capacitance value of the contact capacitor into an analog voltage signal, which is converted into a digital voltage signal and then sent to a fingerprint determination module at a back end to determine finger ridges (Finger Ridge) or finger valleys (Finger Valley) of a fingerprint corresponding to the capacitive sensing circuit. In other words, the analog voltage signal is converted into the digital voltage signal through an analog-to-digital converter (Analog to Digital Convertor, ADC). However, a circuit structure of the analog-to-digital converter is complex and occupies a large circuit area, increasing production costs and consuming higher power. Therefore, providing a capacitive sensing circuit with simple circuit structure, small circuit area, low cost and low power consumption has become one of goals pursued in the industry.

SUMMARY

A primary objective of the present disclosure is to provide a capacitive sensing circuit with a simple circuit structure.

To solve the above technical problem, the present disclosure provides a capacitive sensing circuit configured to sense a contact capacitor, where the capacitive sensing circuit includes a sample-and-hold circuit coupled to the contact capacitor; an integrating circuit including an integrating input terminal coupled to the sample-and-hold circuit and an integrating output terminal; a comparator including a first input terminal coupled to the integrating output terminal, a second input terminal for receiving a reference voltage, and a comparison output terminal for outputting a comparison output voltage; and a logic circuit coupled to the comparison output terminal, where the logic circuit outputs an integration time of the integrating circuit when the comparison output voltage indicates that the comparator performs a transition, where the integration time correlates with a capacitance value of the contact capacitor.

Preferably, the logic circuit generates a control signal to terminate an integration operation of the integrating circuit when the comparison output voltage indicates that the comparator performs a transition.

Preferably, the integration time is an elapsed time from start of the integration operation to termination of the integration operation of the integrating circuit.

Preferably, the sample-and-hold circuit includes a first switch having one end for receiving a positive voltage and the other end coupled to the contact capacitor; and a second switch having one end coupled to the contact capacitor and the other end coupled to the integrating input terminal, where the first switch is turned on and the second switch is turned off at a first time, and the first switch is turned off and the second switch is turned on at a second time.

Preferably, the integrating circuit includes an amplifier, where an amplifying input terminal of the amplifier is the integrating input terminal, and an amplifying output terminal of the amplifier is the integrating output terminal; a third switch coupled between the amplifying input terminal and the amplifying output terminal; an integrating capacitor coupled between the amplifying input terminal and the amplifying output terminal; and a fourth switch having one end coupled to the integrating capacitor and the other end coupled to the amplifying output terminal.

Preferably, the third switch and the fourth switch are turned on when the capacitive sensing circuit is in a reset mode; and the third switch is turned off while the fourth switch is turned on when the integrating circuit performs an integration operation.

The capacitive sensing circuit provided by the present disclosure may convert charge stored in the contact capacitor into a time signal, which has the advantages of simple circuit structure, small circuit area, low cost and low power consumption.

DESCRIPTION OF EMBODIMENTS

In order to make objectives, technical solutions and advantages of the present disclosure clearer, a further detailed description on the present disclosure will be given below in combination with drawings and embodiments. It should be understood that, a specific embodiment described herein are merely used for illustrating the present disclosure, rather than limiting the present disclosure.

Figure 1:
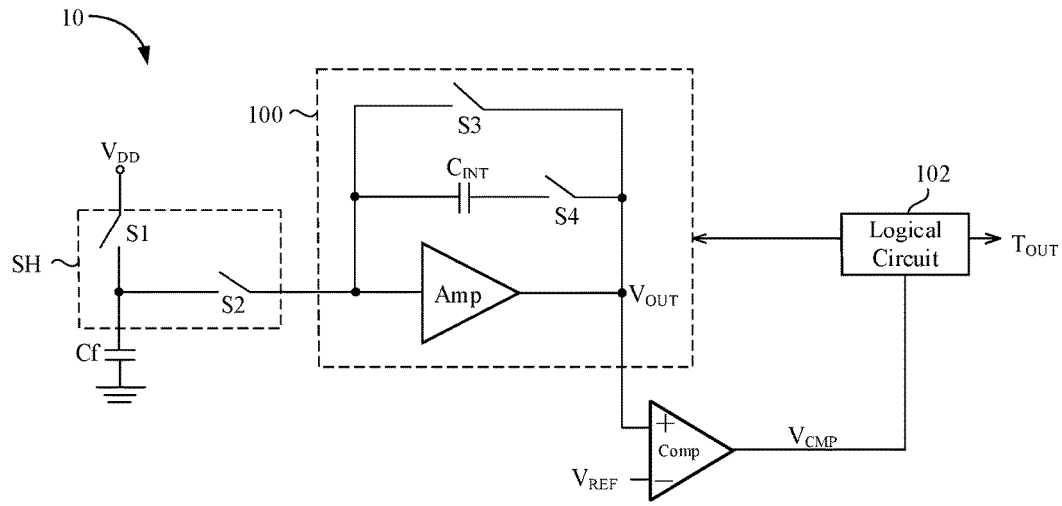
FIG. 1 is a schematic diagram of a capacitive sensing circuit according to an embodiment of the present disclosure.

A capacitive sensing circuit of the present disclosure converts charge stored in a contact capacitor into a time signal to accurately interpret a capacitance value of the contact capacitor and reduce circuit complexity of the capacitive sensing circuit. Specifically, referring to FIG. 1, it is a schematic diagram of a capacitive sensing circuit 10 according to an embodiment of the present disclosure. The capacitive sensing circuit 10 is configured to sense a contact capacitor Cf and includes a sample-and-hold circuit SH, an integrating circuit 100, a comparator (comp) and a logic circuit 102. The integrating circuit 100 includes switches S3 and S4, an amplifier Amp and an integrating capacitor $C_{INT}$. An input terminal of the amplifier Amp is an integrating input terminal of the integrating circuit 100, and an output terminal of the amplifier Amp is an integrating output terminal of the integrating circuit 100, where the integrating output terminal is configured to output an integrating output voltage $V_{OUT}$. In addition, a positive input terminal (labeled with "+") of the comparator comp is coupled to the integrating output terminal of the integrating circuit 100 and configured to receive the integrating output voltage $V_{OUT}$, and a negative input terminal of the comparator comp (labeled with "−") is configured to receive a reference voltage $V_{REF}$. A comparison output terminal of the comparator comp is configured to output a comparison output voltage $V_{CMP}$. The logic circuit 102 may be implemented by a digital circuit and coupled between the comparison output terminal of the comparator comp and the integrating circuit 100. When the comparison output voltage $V_{CMP}$ indicates that the comparator comp performs a transition, the logic circuit 102 outputs an integration time $T_{OUT}$ of the integrating circuit, and the logic circuit 102 generates a control signal (not shown in FIG. 1) and sends it to the integrating circuit 100 to terminate the integration operation of the integrating circuit 100, where the integration time $T_{OUT}$ may represent/reflect a capacitance value of the contact capacitor Cf.

More specifically, the sample-and-hold circuit SH includes a switch S1 and a switch S2. One end of the switch S1 receives a positive voltage $V_{DD}$, and the other end of the switch S1 is electrically connected to the contact capacitor Cf; one end of the switch S2 is electrically connected to the contact capacitor Cf, and the other end of the switch S2 is electrically connected to the integrating input terminal of the integrating circuit 100. In addition, in the integrating circuit 100, the switch S3 is coupled between the integrating input terminal and the integrating output terminal of the integrating circuit 100, the integrating capacitor $C_{INT}$ is connected in series with the switch S4, and the integrating capacitor $C_{INT}$ and the switch S4 are also coupled between the integrating input terminal and the integrating output terminal of the integrating circuit 100. An operation mode of the integrating circuit 100 (or the capacitive sensing circuit 10) may be controlled by a conductive state of the control switches S3 and S4. For example, in a reset (Reset) mode of the capacitive sensing circuit 10, the switches S3 and S4 are turned on; in an integration mode of the capacitive sensing circuit 10 (i.e., when the integrating circuit 100 performs an integrating operation), the switch S3 is turned off and the switch S4 is turned on. If it needs to terminate the integration operation of the integrating circuit 100, the logic circuit 102 may generate a control signal to turn off the switch S4.

When the integrating circuit 100 performs an integration operation, the switch S1 is turned on (ON) and the switch S2 is turned off (OFF) during a first half period (corresponding to a first time) of a clock (Clock) period T, and the contact capacitor Cf is charged to a positive voltage $V_{DD}$; the switch S1 is turned off and the switch S2 is turned on during a second half period (corresponding to a second time) of the clock period T, and charge stored in the contact capacitor Cf flows to the integrating capacitor $C_{INT}$. In other words, when the integrating circuit 100 performs the integrating operation, the integrating output voltage $V_{OUT}$ decreases with time. On the other hand, when the integrating circuit 100 is performed in an integration mode, the integrating output voltage $V_{OUT}$ is continuously decreased until the integrating output voltage $V_{OUT}$ is slightly less than the reference voltage $V_{REF}$, and the comparator comp performs a transition. In this case, the logical circuit 102 generates a control signal to terminate the integration operation of the integrating circuit 100 and outputs an integration time $T_{OUT}$.

Since a capacitance value of the contact capacitor Cf is inversely proportional to the integration time $T_{OUT}$, the smaller the integration time $T_{OUT}$, the larger the capacitance value of the contact capacitor Cf for the same predetermined number $N_{TH}$. Therefore, a back end circuit (not shown in FIG. 1) of the capacitive sensing circuit 10 may determine the capacitance value of the contact capacitor Cf according to the integration time $T_{OUT}$.

Figure 2:
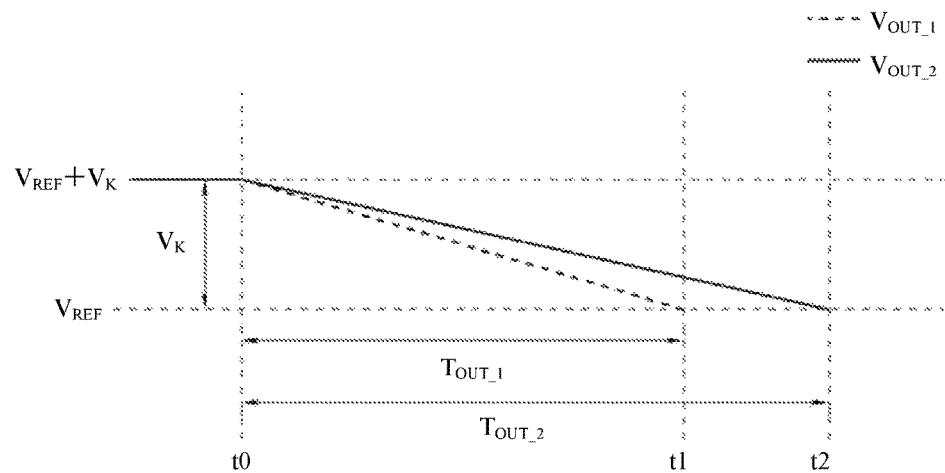
FIG. 2 is a waveform diagram of an integrating output voltage according to an embodiment of the present disclosure.

More specifically, referring to FIG. 2, it is a waveform diagram of an integrating output voltage $V_{OUT\_1}$ and an integrating output voltage $V_{OUT\_2}$ generated by a capacitive sensing circuit 10 for capacitive sensing of a contact capacitor Cf_1 and a contact capacitor Cf_2, respectively, where the contact capacitor Cf_1 has a different capacitance value from the contact capacitor Cf_2. The dotted line represents the waveform of the integrating output voltage $V_{OUT\_1}$, and the solid line represents the waveform of the integrating output voltage $V_{OUT\_2}$. It can be seen from FIG. 2 that the capacitive sensing circuit 10 starts an integration operation (or starts entering an integration mode) at a time $t_0$. When the capacitive sensing circuit 10 perform a capacitive sensing on the contact capacitor Cf_1, as the integrating circuit 100 continues to integrate, the integrating output voltage $V_{OUT}$ is continuously decreased until a time $t_1$ is achieved, i.e., when the integrating output voltage $V_{OUT}$ is slightly less than the reference voltage $V_{REF}$, the comparator comp performs a transition. In this case, the integrating circuit 100 terminates its integration operation and the logical circuit 102 outputs an integration time $T_{OUT\_1}$. Similarly, when the capacitive sensing circuit 10 perform a capacitive sensing on the contact capacitor Cf_2, as the integrating circuit 100 continues to integrate, the integrating output voltage $V_{OUT}$ is continuously decreased until a time $t_2$ is achieved, i.e., when the integrating output voltage $V_{OUT}$ is slightly less than the reference voltage $V_{REF}$, the comparator comp performs a transition. In this case, the integrating circuit 100 terminates the integration operation and the logical circuit 102 outputs an integration time $T_{OUT\_2}$. In this case, a back end circuit of the capacitive sensing circuit 10 may determine capacitance values of the contact capacitors Cf_1 and Cf_2 according to the integration times $T_{OUT\_1}$ and $T_{OUT\_2}$, respectively.

In short, according to the present disclosure, a logical circuit 102 and a comparator comp are used to determine whether an integrating output voltage $V_{OUT}$ output by an integrating circuit 100 is less than a voltage $V_{REF}$. If the integrating output voltage $V_{OUT}$ is less than the voltage $V_{REF}$, the logical circuit 102 outputs an integration time $T_{OUT}$, and a back end circuit of a capacitive sensing circuit 10 may determine a capacitance value of a contact capacitor Cf according to the integration time $T_{OUT}$.

It is known that a capacitive sensing circuit needs to convert charge stored in a contact capacitor into an analog voltage signal and convert the analog voltage signal into a digital voltage signal through an analog-to-digital converter (Analog to Digital Convertor, ADC). However, a circuit structure of the analog-to-digital converter is complex and occupies a large circuit area. In contrast, the capacitive sensing circuit of the present disclosure converts charge stored in the contact capacitor into a time signal (i.e., an integration time $T_{OUT}$) without using an analog-to-digital converter, and a back end circuit may determine a capacitance value of the contact capacitor according to the integration time $T_{OUT}$ and then determine if there is a touch event, or determine finger ridges (Finger Ridge) or finger valleys (Finger Valley) of a fingerprint corresponding to a capacitive sensing circuit for fingerprint identification.

To sum up, a capacitive sensing circuit of the present disclosure may convert charge stored in a contact capacitor into a time signal without using a conventional analog-to-digital converter, and a capacitance value of the contact capacitor can be determined according to an integration time output by the capacitive sensing circuit of the present disclosure. Therefore, the capacitive sensing circuit of the present disclosure has the advantages of simple circuit structure, small circuit area, low cost and low power consumption.

The foregoing descriptions are merely preferred embodiments of the present disclosure, rather than limiting the present disclosure, and any modifications, equivalent substitutions, improvements and the like, made within the spirit and principle of the present disclosure, are all encompassed in the protection scope of the present disclosure.

What is claimed is:

1. A capacitive sensing circuit configured to sense a contact capacitor, wherein the capacitive sensing circuit comprises:
   a sample-and-hold circuit coupled to the contact capacitor;
   an integrating circuit comprising:
      an integrating input terminal coupled to the sample-and-hold circuit; and
      an integrating output terminal;
   a comparator comprising:
      a first input terminal coupled to the integrating output terminal;
      a second input terminal for receiving a reference voltage; and
      a comparison output terminal for outputting a comparison output voltage; and
   a logic circuit coupled to the comparison output terminal, wherein the logic circuit outputs an integration time of the integrating circuit when the comparison output voltage indicates that the comparator performs a transition,
   wherein the integration time is an elapsed time from start of the integration operation to termination of the integration operation of the integrating circuit and the integration time correlates with a capacitance value of the contact capacitor.

2. The capacitive sensing circuit according to claim 1, wherein the logic circuit generates a control signal to terminate an integration operation of the integrating circuit when the comparison output voltage indicates that the comparator performs a transition.

3. The capacitive sensing circuit according to claim 1, wherein the sample-and-hold circuit comprises:
   a first switch having one end for receiving a positive voltage and the other end coupled to the contact capacitor; and
   a second switch having one end coupled to the contact capacitor and the other end coupled to the integrating input terminal,
   wherein the first switch is turned on and the second switch is turned off at a first time, and the first switch is turned off and the second switch is turned on at a second time.

4. The capacitive sensing circuit according to claim 1, wherein the integrating circuit comprises:
   an amplifier, wherein an amplifying input terminal of the amplifier is the integrating input terminal, and an amplifying output terminal of the amplifier is the integrating output terminal;
   a third switch coupled between the amplifying input terminal and the amplifying output terminal;
   an integrating capacitor coupled between the amplifying input terminal and the amplifying output terminal; and
   a fourth switch having one end coupled to the integrating capacitor and the other end coupled to the amplifying output terminal.

5. The capacitive sensing circuit according to claim 4, wherein the third switch and the fourth switch are turned on when the capacitive sensing circuit is in a reset mode; and the third switch is turned off while the fourth switch is turned on when the integrating circuit performs an integration operation.

* * * * *